United States Patent
Song

(10) Patent No.: US 9,857,042 B2
(45) Date of Patent: Jan. 2, 2018

(54) LIGHT SOURCE MODULE AND LIGHTING DEVICE HAVING SAME

(71) Applicant: SAMSUNG ELECTRONICS CO., LTD., Suwon-si (KR)

(72) Inventor: Jin Kwan Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 43 days.

(21) Appl. No.: 15/056,269

(22) Filed: Feb. 29, 2016

(65) Prior Publication Data

US 2017/0045190 A1 Feb. 16, 2017

(30) Foreign Application Priority Data

Aug. 12, 2015 (KR) .................. 10-2015-0113812

(51) Int. Cl.

| | |
|---|---|
| *F21S 4/00* | (2016.01) |
| *F21S 8/10* | (2006.01) |
| *H01L 25/075* | (2006.01) |
| *H01L 33/64* | (2010.01) |
| *F21Y 107/50* | (2016.01) |
| *F21Y 115/10* | (2016.01) |

(52) U.S. Cl.
CPC ......... *F21S 48/1109* (2013.01); *F21S 48/115* (2013.01); *F21S 48/212* (2013.01); *F21S 48/215* (2013.01); *F21S 48/321* (2013.01); *F21S 48/328* (2013.01); *H01L 25/0756* (2013.01); *H01L 33/642* (2013.01); *F21Y 2107/50* (2016.08); *F21Y 2115/10* (2016.08)

(58) Field of Classification Search
CPC .. F21S 4/00; F21V 21/00; F21V 29/00; F21V 7/04
USPC ................ 362/249, 294, 516, 606, 613
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |

(Continued)

FOREIGN PATENT DOCUMENTS

| | | |
|---|---|---|
| KR | 10-1081540 B1 | 11/2011 |
| KR | 10-2013-0114842 A | 10/2013 |

(Continued)

*Primary Examiner* — Edwyn Labaze
(74) *Attorney, Agent, or Firm* — Sughrue Mion, PLLC

(57) ABSTRACT

A light source module includes a frame having a plurality of mounting surfaces at different levels and side surfaces respectively connected to the plurality of mounting surfaces; a plurality of heat dissipaters respectively disposed on the plurality of mounting surfaces and extending to cover a side surface of the frame; and a light source including a plurality of light emitting devices respectively disposed on the plurality of heat dissipaters and respectively positioned above the plurality of mounting surfaces.

20 Claims, 12 Drawing Sheets

(56) References Cited

U.S. PATENT DOCUMENTS

| | | |
|---|---|---|
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2008/0090137 A1 | 4/2008 | Buck et al. |
| 2012/0014131 A1* | 1/2012 | Kim ............... G02B 6/0068 362/606 |
| 2012/0162985 A1* | 6/2012 | Kauffman ........... F21V 5/007 362/244 |
| 2013/0077304 A1 | 3/2013 | Gordin et al. |
| 2014/0020882 A1* | 1/2014 | Konishi ............ H01L 33/642 165/185 |
| 2014/0055077 A1 | 2/2014 | Barrass et al. |
| 2014/0063805 A1 | 3/2014 | Song et al. |
| 2014/0140062 A1 | 5/2014 | Choi et al. |
| 2015/0103539 A1 | 4/2015 | Lee |

FOREIGN PATENT DOCUMENTS

| | | |
|---|---|---|
| KR | 10-1329958 B1 | 11/2013 |
| KR | 10-2014-0028654 A | 3/2014 |
| KR | 10-2014-0053007 A | 5/2014 |
| KR | 10-2014-0054921 A | 5/2014 |
| KR | 10-2014-0065110 A | 5/2014 |
| KR | 10-2014-0069288 A | 6/2014 |
| KR | 10-2014-0141849 A | 12/2014 |
| KR | 10-2015-0021128 A | 2/2015 |
| KR | 10-2015-0042567 A | 4/2015 |
| KR | 10-2015-0052500 A | 5/2015 |
| WO | 2008/048751 A2 | 4/2008 |
| WO | 2012/146945 A1 | 11/2012 |
| WO | 2013/048853 A1 | 4/2013 |

* cited by examiner

LIGHT SOURCE MODULE AND LIGHTING DEVICE HAVING SAME

CROSS-REFERENCE TO RELATED APPLICATION

This application claims priority from Korean Patent Application No. 10-2015-0113812, filed on Aug. 12, 2015, with the Korean Intellectual Property Office, the disclosure of which is incorporated herein by reference in its entirety.

BACKGROUND

Methods and apparatuses consistent with example embodiments relate to a light source module and a lighting device including the same.

Light source modules having a plurality of light emitting diodes (LEDs) with varying structural design have been widely used in vehicle headlamps. Such light source modules commonly have an LED structural arrangement specifically designed based on the varying designs of individual vehicle models.

In order to be used in these individual vehicle models, a new mold must be designed and manufactured every time a new model of car is manufactured based on a design of a lamp of each specific model of car. These molds need to be retained and managed until the discontinuation of the specific model of vehicle it is used to manufacture headlamps for.

SUMMARY

Example embodiments provide a standardized structure for supporting a light emitting device, such as a heat sink, such that the structure may be commonly used in vehicles regardless of the model thereof and maintenance thereof may be facilitated.

The object of the present inventive concept is not limited thereto, and even if not explicitly mentioned, purposes or effects that may be grasped from a summary and example embodiments described below is included therein.

According to an aspect of an example embodiment, there is provided a light source module including: a frame including a plurality of mounting surfaces arranged at different levels and side surfaces respectively connected to the plurality of mounting surfaces; a plurality of heat dissipaters respectively disposed on the plurality of mounting surfaces and extending to cover one of the side surfaces of the frame; and a light source including a plurality of light emitting devices respectively disposed on the plurality of heat dissipaters and respectively positioned above the plurality of mounting surfaces.

Each of the heat dissipaters may include a base portion respectively disposed on each of the plurality of mounting surfaces, and an extension portion bent at an edge of the corresponding base portion and extending along the side surface.

The frame may include at least one protrusion disposed on each of the plurality of mounting surfaces, and the base portion may include at least one connecting hole into which the at least one protrusion is inserted.

The extension portion may be substantially perpendicular to the base portion, and extend downward past the side surface of the frame.

Each of the mounting surfaces of the frame may have a corresponding heat dissipater of the plurality of heat dissipaters disposed thereon.

Each of the mounting surfaces of the frame may have a corresponding pair heat dissipaters of the plurality of heat dissipaters overlappingly disposed thereon.

Each corresponding pair of heat dissipaters may extend along opposing side surfaces.

The frame may include a stepped structure defining the different levels of the plurality of mounting surfaces rise in an arrangement direction.

The frame may further include a plurality of connecting surfaces vertically connecting the plurality of mounting surfaces to each other.

The light source may further include a substrate disposed between the plurality of heat dissipaters and the plurality of light emitting devices, and the substrate may have the plurality of light emitting devices mounted thereon.

The substrate may integrally connect the plurality of heat dissipaters.

The substrate may have a stepped structure corresponding to the plurality of mounting surfaces.

According to an aspect of another example embodiment, there is provided a lighting device including: a light source module; a housing supporting the light source module; and a cover fastened to the housing to cover the light source module. The light source module includes: a frame having a plurality of mounting surfaces arranged at different levels and side surfaces respectively connected to the plurality of mounting surfaces; a plurality of heat dissipaters respectively disposed on the plurality of mounting surfaces and extending to cover a side surface of the frame; and a plurality of light emitting devices respectively disposed on the plurality of heat dissipaters and respectively positioned above the plurality of mounting surfaces.

The lighting device may further include a reflector configured to reflect light of the light source module.

The reflector may further include a plurality of reflective surfaces and a plurality of through holes respectively formed on a bottom surface of each of the plurality of reflective surfaces, and the plurality of light emitting devices may be respectively exposed to the plurality of reflective surfaces through the through holes.

According to an aspect of yet another example embodiment, there is provided a light emitting device including: a stepped frame defining a plurality of mounting surfaces, a first side surface and a second side surface; a first plurality of heat dissipaters, each of the first plurality of heat dissipaters including a first connecting portion respectively disposed on the plurality of mounting surfaces and a first extension portion extending along the first side surface; and a plurality of light sources respectively disposed on the first connecting portion of each of the plurality of heat dissipaters.

The light emitting device may further include a second plurality of heat dissipaters, each of the second plurality of heat dissipaters may include a second connecting portion respectively disposed on the plurality of first connecting portions and a second extension portion extending along the second side surface.

The stepped frame may further define a plurality of protrusions, each of the plurality of protrusions respectively disposed on the plurality of mounting surfaces, and the first plurality of heat dissipaters may include a plurality of through holes corresponding to the plurality of protrusions.

The light emitting device may further include a wavelength converter including a phosphor, and the wavelength converter may be located so light emitted from the plurality of light sources is incident on the phosphor.

Each of the plurality of light sources may include a light emitting diode.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
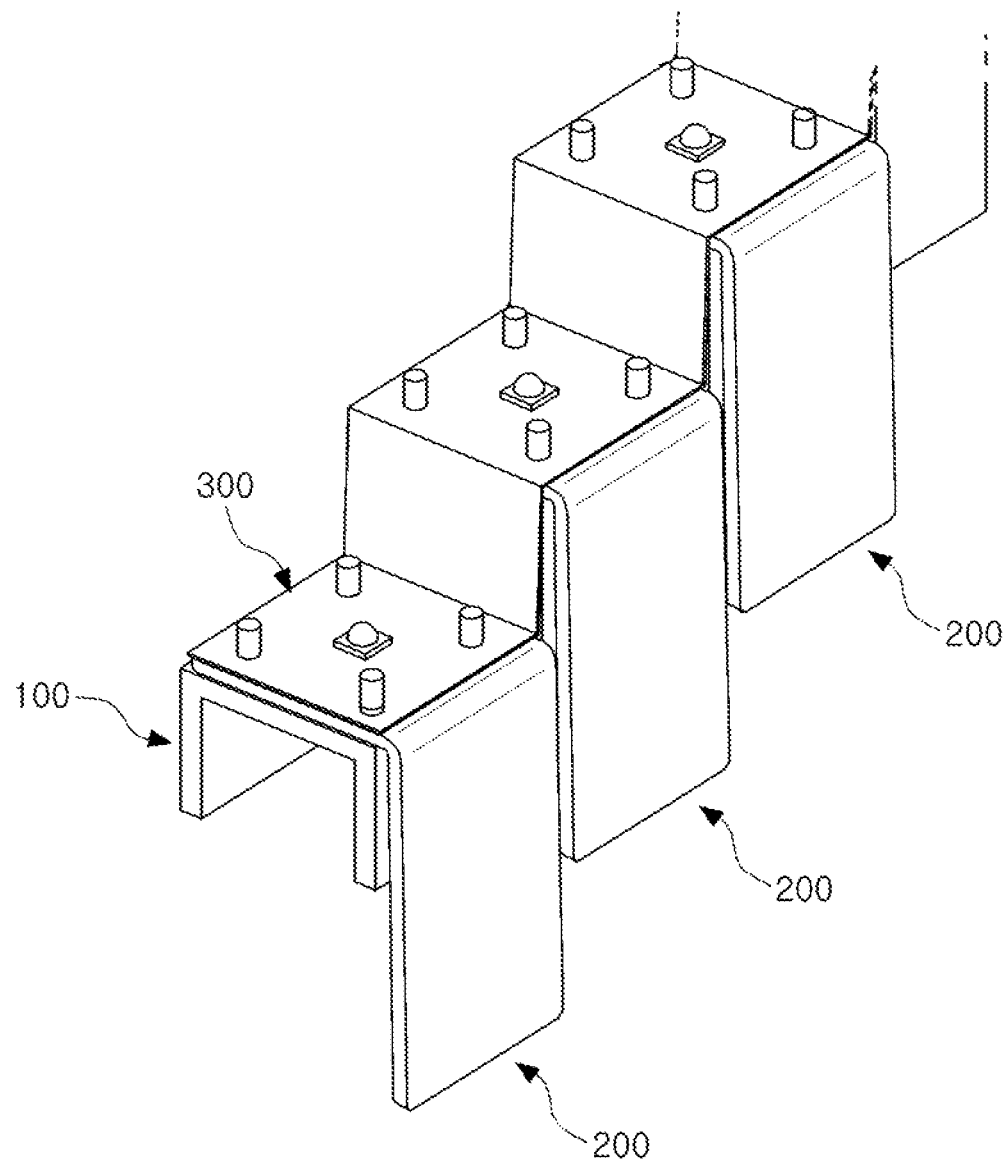
FIG. 1 is a perspective view schematically illustrating a light source module according to an example embodiment.

Hereinafter, example embodiments will be described as follows with reference to the attached drawings.

The present inventive concept may, however, be exemplified in many different forms and should not be construed as being limited to the example embodiments set forth herein. Rather, these example embodiments are provided so that this disclosure will be thorough and complete, and will fully convey the scope of the disclosure to those skilled in the art.

Throughout the specification, it will be understood that when an element, such as a layer, region or substrate, is referred to as being "on," "connected to," or "coupled to" another element, it can be directly "on," "connected to," or "coupled to" the other element, or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular example embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Hereinafter, example embodiments will be described with reference to schematic views. In the drawings, for example, due to manufacturing techniques and/or tolerances, modifications of the shape shown may be estimated. Thus, example embodiments concept should not be construed as being limited to the particular shapes of regions shown herein, for example, to include a change in shape results in manufacturing. The following example embodiments may also be constituted as one or a combination thereof.

The contents described below may have a variety of configurations and propose only a required configuration herein, but are not limited thereto.

Meanwhile, the term "an example embodiment" used throughout this specification does not refer to the same example embodiment, and the term is provided to emphasize a particular feature or characteristic different from another example embodiment. However, example embodiments provided hereinafter are considered to be able to be implemented by being combined in whole or in part one with another. For example, one element described in a particular example embodiment, even if it is not described in another example embodiment, may be understood as a description related to another example embodiment, unless an opposite or contradictory description is provided therein.

Figure 2:
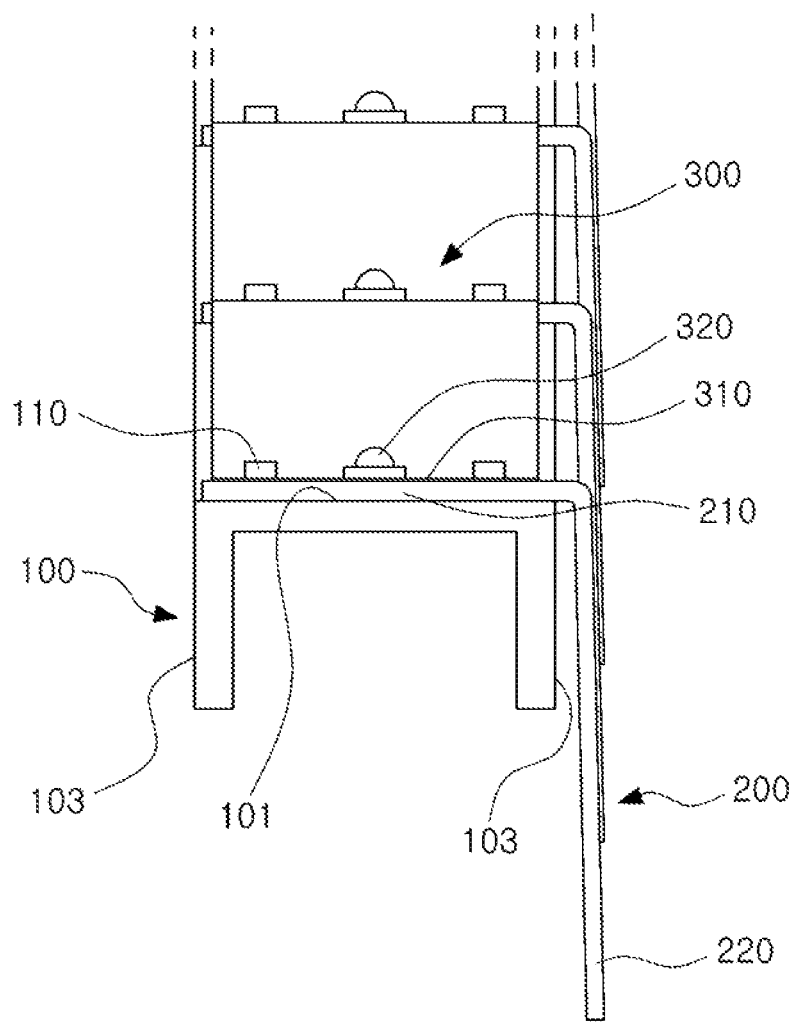
FIG. 2 is a front view of the light source module illustrated in FIG. 1.
Figure 3:
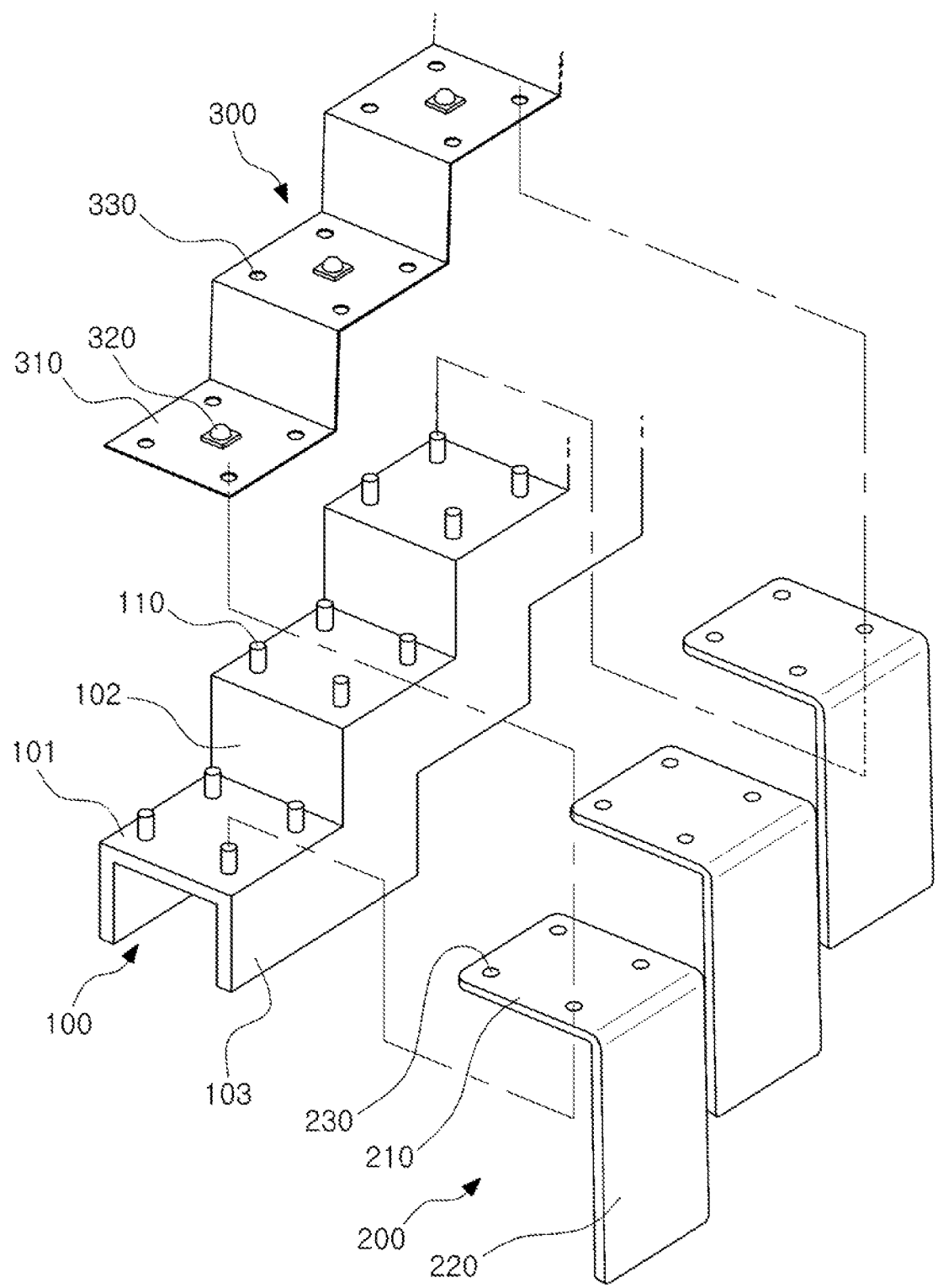
FIG. 3 is an exploded perspective view of the light source module illustrated in FIG. 1.

Referring to FIGS. 1 through 3, a light source module according to an example embodiment will be described.

FIG. 1 is a perspective view schematically illustrating a light source module according to an example embodiment. FIG. 2 is a front view of the light source module illustrated in FIG. 1. FIG. 3 is an exploded perspective view of the light source module illustrated in FIG. 1.

As illustrated in FIGS. 1 through 3, a light source module 10 according to an example embodiment may include a frame unit 100 having a plurality of mounting surfaces 101, a heat dissipation unit 200, and a light source unit 300.

The frame unit 100 may have the plurality of mounting surfaces 101, and the plurality of mounting surfaces 101 may be arranged to have different levels. The frame unit 100 may have a stepped structure in which the plurality of mounting surfaces 101 are connected to each other and positioned at different levels which rise in an arrangement direction.

As illustrated in FIG. 3, the frame unit 100 may include the plurality of mounting surfaces 101 corresponding to an upper surface of the frame unit 100, connecting surfaces 102 connecting the plurality of mounting surfaces 101, and side surfaces 103.

The plurality of mounting surfaces 101 may be positioned at different levels. For example, the plurality of mounting surfaces 101 may be disposed at different heights. The illustrated example embodiment exemplifies each of the mounting surfaces 101 having a quadrangular shape, but is not limited thereto.

Each of the mounting surfaces 101 may have a plurality of protrusions 110 protruding upwardly. The plurality of protrusions 110 may have a cylindrical shape, and may be arranged to be spaced apart from each other at regular intervals. The illustrated example embodiment exemplifies four protrusions 110 arranged in a quadrangular form, but is not limited thereto. The number of the protrusions 110 may be changed in various manners.

Each of the connecting surfaces 102 may be positioned between the plurality of mounting surfaces 101, and may interconnect two adjacent mounting surfaces 101 positioned at different levels. For example, the connecting surface 102 may extend downwardly from a side of the mounting surface 101 disposed in a relatively high position and may be connected to the other side of anther mounting surface 101 disposed in a relatively low position.

The illustrated example embodiment exemplifies the connecting surface 102 vertically connected to each of the mounting surfaces 101, but is not limited thereto. For example, the connecting surface 102 may be connected to each of the mounting surfaces 101 at a predetermined slope.

The side surfaces 103 may extend downwardly in a vertical direction from opposing edges, in a width direction, of the plurality of mounting surfaces 101, respectively. The side surfaces 103 may be connected to opposing edges of the connecting surface 102. The side surfaces 103 may have a structure in which bottoms of the side surfaces 103 may have different levels to correspond to the plurality of mounting surfaces 101 positioned at different levels.

The illustrated example embodiment has three mounting surfaces 101, but example embodiments are not limited thereto. For example, the number of mounting surfaces 101 may be varied depending on designs of structures of lighting devices for various models of vehicle.

The illustrated example embodiment also exemplifies the frame unit 100 extending in a longitudinal direction and having an overall linear structure, but is not limited thereto. For example, the frame unit 100 may have a curved structure having a curved surface.

The frame unit 100 may be, for example, formed by injecting a resin, such as polycarbonate (PC) or polymethylmethacrylate (PMMA) into a mold and solidifying the resin. For example, methods such as injection molding, transfer molding, or compression molding may be used.

The heat dissipation units 200 may be fixedly attached to the plurality of mounting surfaces 101, respectively. Each of the heat dissipation units 200 attached to the frame unit 100 may cover each of the mounting surfaces 101 of the frame unit 100, and a side surface 103 perpendicular to each mounting surface 101.

The heat dissipation unit 200 may be a type of heat sink detachably attached to the mounting surface 101, and may emit heat generated by a light source unit 300 to the outside while supporting the light source unit 300 that will be described later.

The heat dissipation unit 200 may include a base portion 210 disposed on each of the mounting surfaces 101 of the frame unit 100, and an extension portion 220 bent at an edge of the base portion 210 to extend downwardly along a side surface 103. The heat dissipation unit 200 may have, for example, an overall L-shape (see FIG. 2).

The base portion 210 and the extension portion 220 may be integrated with each other by press working of, for example, a single metal plate having a rectangular shape. In addition, due to the relatively simple structure, the heat dissipation unit 200 may be mass produced.

The base portion 210 may have a shape corresponding to the mounting surface 101. The base portion 210 may include a plurality of connecting holes 230 into which the plurality of protrusions 110 protruding from the mounting surface 101 may be inserted.

The plurality of connecting holes 230 may penetrate through the base portion 210. Positions of the plurality of connecting holes 230 may correspond to positions in which the plurality of protrusions 110 are disposed.

The extension portion 220 may be substantially perpendicular to the base portion 210, and may extend downwardly further than a side surface 103 of the frame unit 100. A surface of the extension portion 220 exposed to the outside of the frame unit 100 may define a heat dissipation surface of the heat dissipation unit 200. Thus, heat dissipation efficiency may be further improved by increasing an area in which the extension portion 220 may contact air.

The heat dissipation units 200 may be attached to the respective mounting surfaces 101 of the frame unit 100 one by one. The heat dissipation units 200 attached to the respective mounting surfaces 101 may be disposed such that the extension portions 220 may face in identical directions (see FIGS. 1 and 2). In addition, although not illustrated in the drawings, the heat dissipation units 200 may be disposed in zigzags based on the opposing side surfaces 103 of the frame unit 100.

The light source unit 300 may include a substrate 310 disposed on the plurality of heat dissipation units 200, and a plurality of light emitting devices 320 mounted on the substrate 310.

The substrate 310 may be disposed on the respective base portions 210 of the plurality of heat dissipation units 200, and may extend to integrally connect the plurality of heat dissipation units 200 to each other. The substrate 310 may have a stepped structure to correspond to the stepped structure of the frame unit 100, and may be mounted on the frame unit 100. Thus, the substrate 310 may include a flexible printed circuit board (FPCB) that may be freely bent to correspond to different positions of the respective base portions 210 depending on the stepped structure.

The substrate 310 may include a plurality of through holes 330 into which the plurality of protrusions 110 may be inserted. The substrate 310 disposed on the respective base portions 210 of the plurality of heat dissipation units 200 may be mounted on the frame unit 100 in a structure in which the plurality of protrusions 110 protruding above the base portions 210 may be inserted into the plurality of through holes 330.

The plurality of light emitting devices 320 may be provided on the plurality of heat dissipation units 200, respectively, and may be disposed above the plurality of mounting surfaces 101, respectively.

The light emitting devices 320 may be optoelectronic devices that may generate light having a predetermined wavelength by driving power applied from the outside. For example, the light emitting devices 320 may include a semiconductor light emitting diode (LED) chip having an n-type semiconductor layer, a p-type semiconductor layer, and an active layer interposed therebetween, or an LED package including the LED chip therein.

The light emitting devices 320 may emit blue, green or red light in accordance with a material contained therein or a combination of phosphors, and may also emit white light, ultraviolet light, and the like. The light emitting devices 320 may be variously configured to generate light having the same wavelength or different wavelengths. The light emitting devices 320 may be variously configured depending on power levels such as 0.5 W and 1 W.

As light emitting devices 320, LED chips having various structures or various types of LED packages having such LED chips therein may be used. The illustrated example embodiment exemplifies the light emitting device 320 being an LED package, but the present disclosure is not limited thereto. A detailed configuration and structure of the light emitting devices 230 will be described later.

As such, the plurality of heat dissipation units 200 may have a standardized shape, and may be mass produced. The plurality of heat dissipation units 200 may be attached to the frame unit 100 in a required number to form a heat sink structure having a stepped structure for mounting the light source unit 300.

Because the heat dissipation units 200 have a standardized shape, the heat dissipation units 200 may be commonly used, regardless of vehicle model. The heat dissipation units 200 may also allow a heat sink structure satisfying design conditions of respective vehicle models to be easily manufactured by being attached to the frame unit 100 in a required amount. For example, vehicle headlamps, daytime running lights (DRL), rear lamps (tail lights), and the like may have various design structures depending on vehicle models, and a heat sink structure may have a step portion to fit a portion having a curved shape as an edge of a vehicle. For example, a step may be formed between areas on which the respective light emitting devices may be mounted respectively.

Conventionally, a separate integrated heat sink structure having various amounts and step structures has been manufactured according to vehicle models. To this end, there has been a need for manufacturing a separate mold for each vehicle model.

According to the example embodiment, the heat sink structure may be easily manufactured by attaching more or fewer heat dissipation units 200, which may be used in common by having a standardized shape, to meet design structures of lamps for each vehicle. Thus, there is no need to separately manufacture an integrated heat sink structure having a plurality of steps for each vehicle model as in the related art. For this, a separate mold is not required to be manufactured for each vehicle model, thereby reducing investment costs and manufacturing costs.

Figure 4:
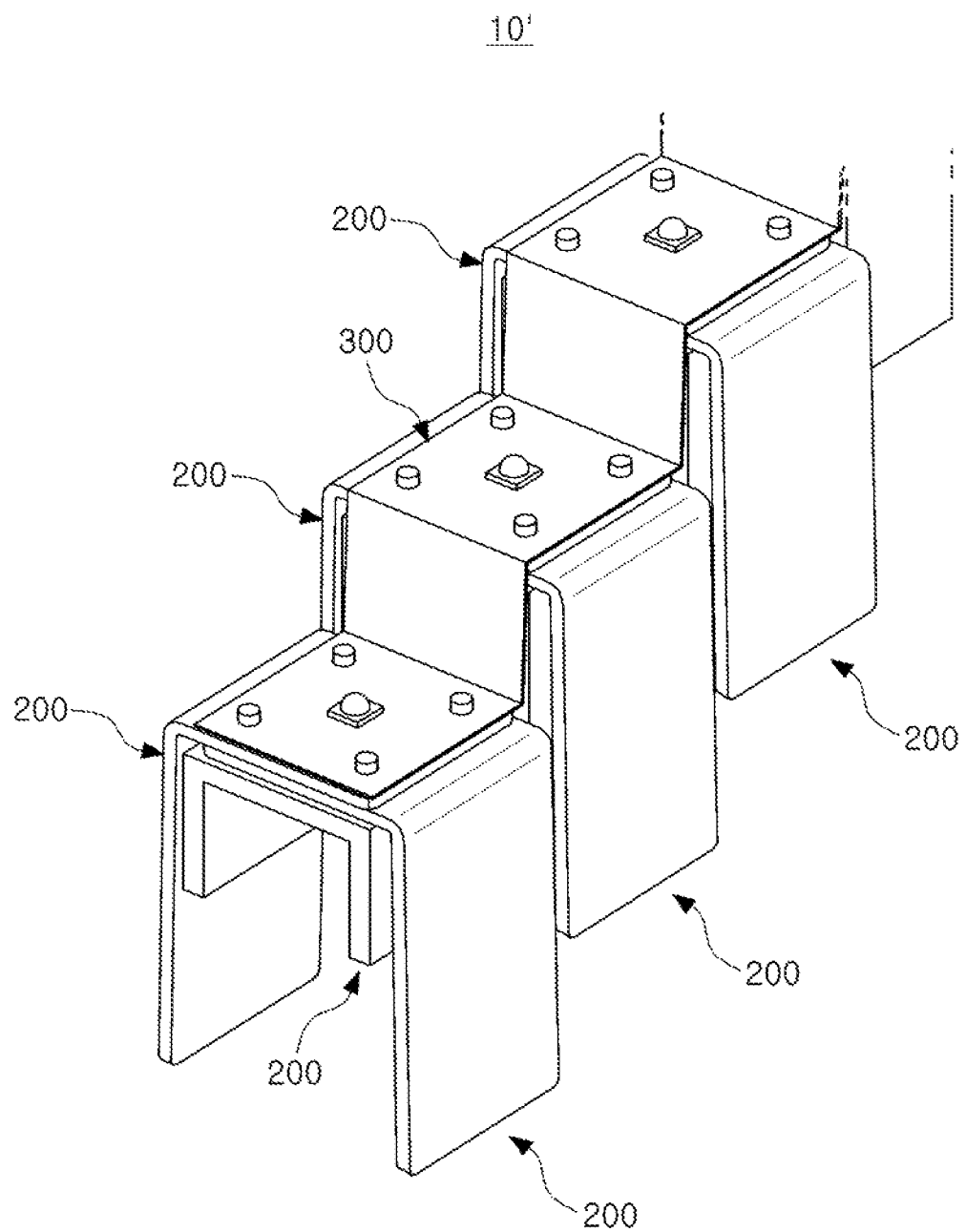
FIG. 4 is a perspective view schematically illustrating a light source module according to another example embodiment.
Figure 5:
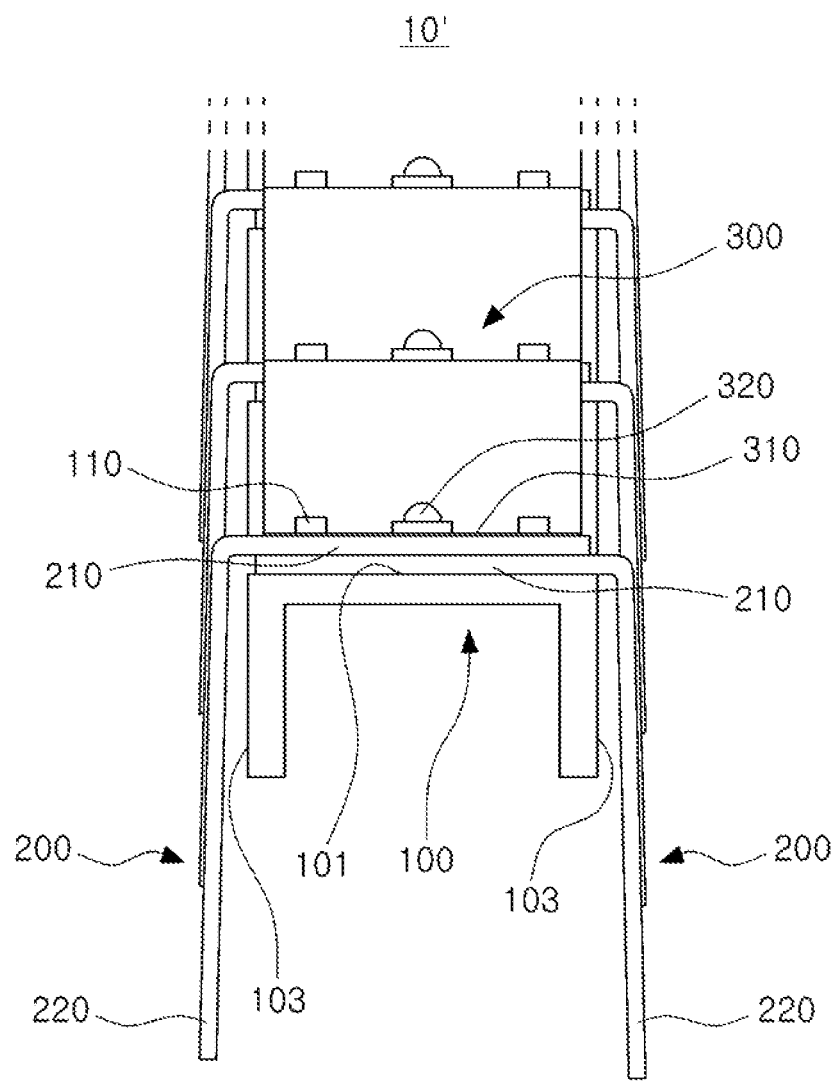
FIG. 5 is a front view of the light source module illustrated in FIG. 4.
Figure 6:
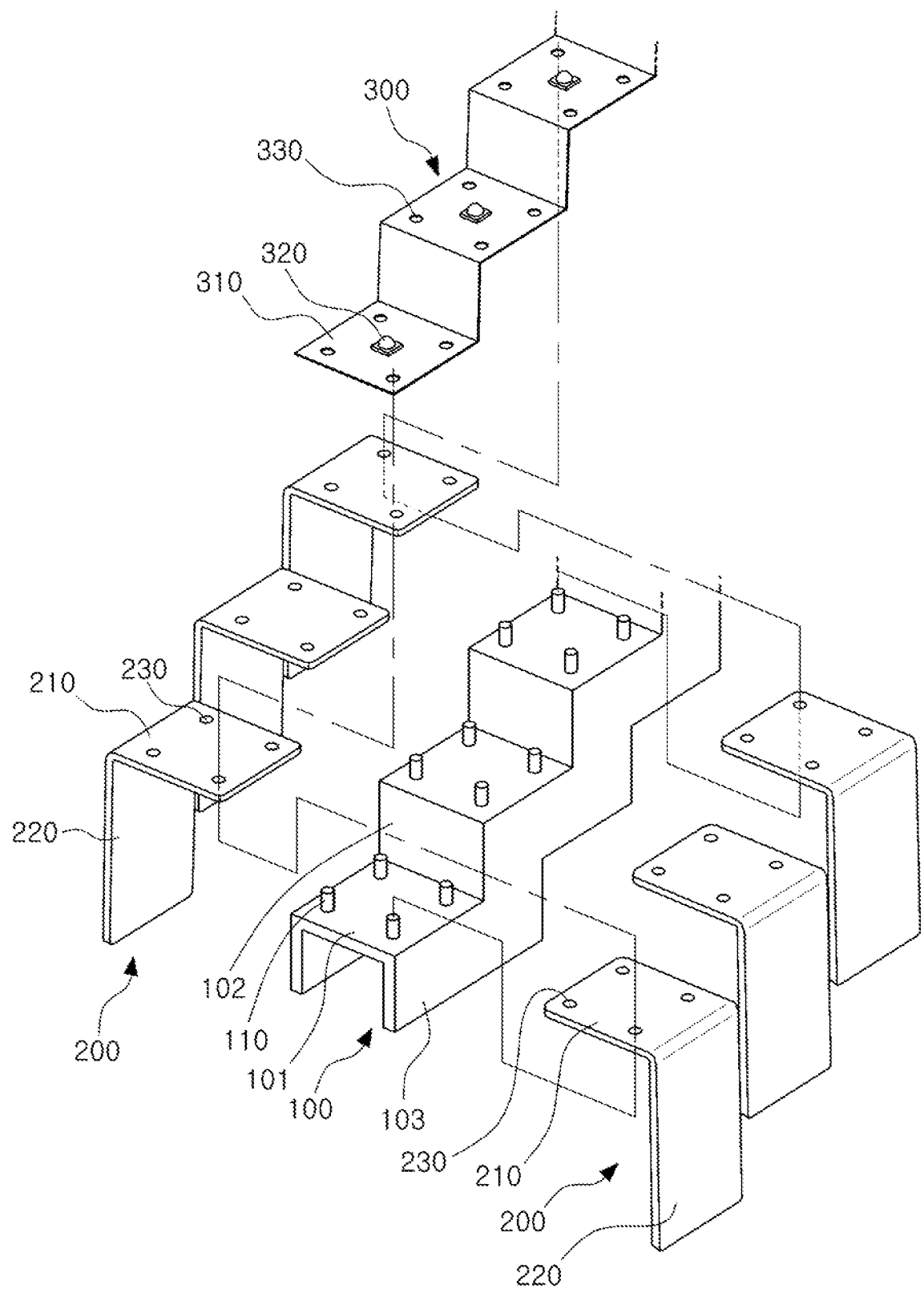
FIG. 6 is an exploded perspective view of the light source module illustrated in FIG. 4.

FIGS. 4 through 6 illustrate a light source module according to another example embodiment. FIG. 4 is a perspective view schematically illustrating a light source module according to another example embodiment. FIG. 5 is a front view of the light source module illustrated in FIG. 4. FIG. 6 is an exploded perspective view of the light source module illustrated in FIG. 4.

A configuration of the light source module according to the example embodiments illustrated in FIGS. 4 through 6 is substantially identical to a basic structure of the example embodiments illustrated in FIGS. 1 through 3. Because a structure of a heat dissipation unit is different from that of the heat dissipation unit illustrated in FIGS. 1 through 3, descriptions of elements overlapping with those of the example embodiments described above will be hereinafter omitted and a configuration of the heat dissipation unit will be described.

As illustrated in FIGS. 4 through 6, a light source module 10' according to an example embodiment may include a frame unit 100 having a plurality of mounting surfaces 101, heat dissipation units 200, and a light source unit 300.

The frame unit 100 may have the plurality of mounting surfaces 101, and the plurality of mounting surfaces 101 may be arranged to have different levels.

The heat dissipation units 200 may be fixedly attached to the plurality of mounting surfaces 101, respectively. The respective heat dissipation units 200 attached to the frame unit 100 may cover the respective mounting surfaces 101 of the frame unit 100, and side surfaces 103 perpendicular to the respective mounting surfaces 101.

Each of the heat dissipation unit 200 may include a base portion 210 disposed on each of the mounting surfaces 101 of the frame unit 100, and an extension portion 220 bent at an edge of the base portion 210 to extend downwardly along a side surfaces 103.

A pair of heat dissipation units 200 may be overlappingly attached to each mounting surface 101 of the frame unit 100 while being opposed to each other. For example, it may be understood that a single heat dissipation unit 200 is attached to each mounting surface 101 in the previous example embodiment of FIG. 1, but the example embodiments of FIGS. 4 through 6 are substantially identical to the previous example embodiment except that two heat dissipation units 200 are attached to each mounting surface 101 while overlapping each other.

For example, the heat dissipation unit 200 may be attached to the mounting surface 101 to cover a right side surface 103, and another heat dissipation unit 200 may be attached to the mounting surface 101 by overlapping the heat dissipation unit 200 to cover a left side surface.

As illustrated in FIG. 5, the pair of heat dissipation units 200 may extend alongside opposing side surfaces 103 to face each other with the frame unit 100 interposed between the pair of heat dissipation units 200.

The light source unit 300 may be fixedly disposed on the plurality of heat dissipation units 200. The light source unit 300 may include a substrate 310 disposed on the plurality of heat dissipation units 200, and a plurality of light emitting devices 320 mounted on the substrate 310.

As such, the light source module according to the example embodiment may allow the quantity of heat dissipation units attached to be properly adjusted if necessary, thereby improving heat dissipation efficiency. In particular, heat dissipation efficiency may be increased by flexibly adjusting the quantity of heat dissipation units attached depending on output of a light emitting device, a heat source. For example, the quantity of heat dissipation units may be properly adjusted by only attaching a single heat dissipation unit in the case of a 0.5 W light emitting device as in FIG. 1, and attaching two heat dissipation units in the case of a 1 W light emitting device as in FIG. 4.

In addition, because a plurality of heat dissipation units 200 forming a heat sink structure in the light source module may have a standardized structure having an identical shape, the plurality of heat dissipation units 200 may be mass produced, and thus manufacturing costs may be reduced.

Further, the plurality of heat dissipation units 200 may flexibly respond to a change in a design of a headlamp or the like depending on vehicle models. For example, a light source module for each vehicle model may be easily manufactured by attaching a required amount of heat dissipation units to the frame unit.

Figure 7A:
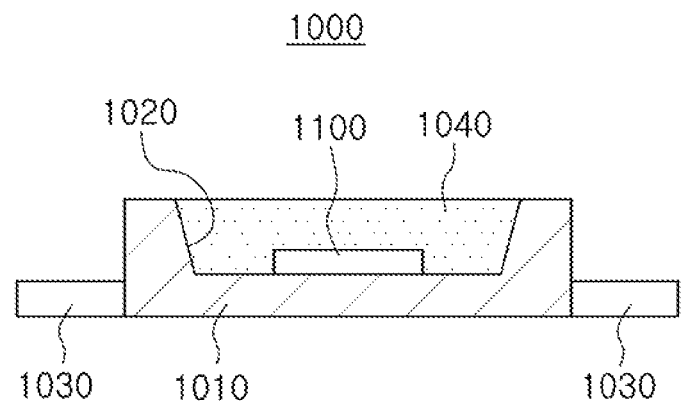
FIGS. 7A and 7B are schematic cross-sectional views respectively illustrating light emitting devices employable in a light source module according to an example embodiment.
Figure 7B:
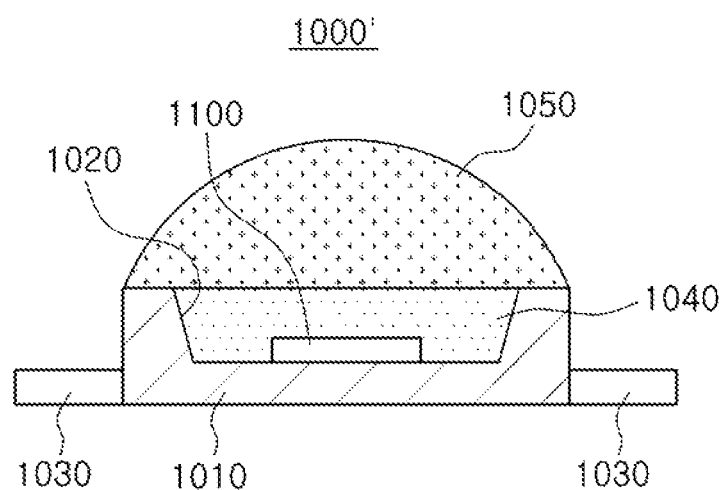

A light emitting device that may be employed in a light source module according to an example embodiment will be described hereinafter. FIGS. 7A and 7B schematically illustrate light emitting devices employable in a light source module according to an example embodiment.

As illustrated in FIG. 7A, a light emitting device 1000 according to an example embodiment may have a package structure in which an LED chip 1100 is mounted in a body 1010 having a reflective cup 1020.

The body 1010 may support the mounted LED chip 1100, and may be formed of a molding compound, such as a white molding compound, having high light reflectivity. This may reflect light emitted from the LED chip 1100 to increase an amount of light emitted externally. Such a white molding compound may include a thermosetting-based resin having high heat resistance or a silicone-based resin. The white molding compound may also include a thermoplastic based resin to which a white pigment, a filler, a curing agent, a releasing agent, an antioxidant, an adhesion improver, and the like are added. Further, the white molding compound may include FR-4, CEM-3, an epoxy material or a ceramic material. In addition, the white molding compound may include a metal material, such as aluminum (Al).

The body 1010 may have a lead frame 1030 mounted on the substrate 310 to be electrically connected to an external power source. The lead frame 1030 may be formed of a material having excellent electrical conductivity, for example, metal materials, such as aluminum, copper, and the like. If the body 1010 is formed of a metal material, an insulating material may be interposed between the body 1010 and the lead frame 1030.

The reflective cup 1020 provided in the body 1010 may allow the lead frame 1030 to be exposed to a bottom surface of the reflective cup 1020, on which the LED chip 1100 is mounted. The LED chip 1100 may be electrically connected to the exposed lead frame 1030.

The size of a cross section of the reflective cup 1020 exposed to an upper surface of the body 1010 may be larger than that of the bottom surface of the reflective cup 1020. Here, the cross section of the reflective cup 1020 exposed to the upper surface of the body 1010 may define a light emitting surface of the light emitting device 1000.

The LED chip 1100 may be encapsulated by an encapsulant 1040 formed in the reflective cup 1020 of the body 1010. The encapsulant 1040 may contain a wavelength conversion material.

FIG. 7B schematically illustrates a modification of a light emitting device 1000'. As illustrated in FIG. 7B, the body 1010 may further include a lens 1050 attached thereto to cover the encapsulant 1040.

The lens 1050 may have a hemispherical structure, for example, a convex lens. The lens 1050 may refract light generated by the LED chip 1100 to be radiated in a wider range.

A wavelength conversion material contained in the encapsulant 1040 may contain, for example, at least one or more phosphors emitting light having a different wavelength by being excited by light generated by the LED chip 1100. This may allow the wavelength of light to be controlled such that various colors of light including white light may be emitted.

For example, when the LED chip 1100 emits blue light, white light may be emitted by combining yellow, green, red and/or orange phosphors with each other. In addition, at least one LED chip emitting purple, blue, green, red or infrared light may be included. In this case, the LED chip 1100 may adjust a color rendering index (CRI) from 40 to 100, and may emit various kinds of white light having a color temperature ranging from about 2,000K to about 20,000K. If necessary, the LED chip 1100 may also emit purple, blue, green, red, and orange visible light or infrared light to adjust the color of light according to surroundings or a desired mood. Further, the LED chip 1100 may emit light having a certain wavelength that is able to promote the growth of plants.

Figure 8:
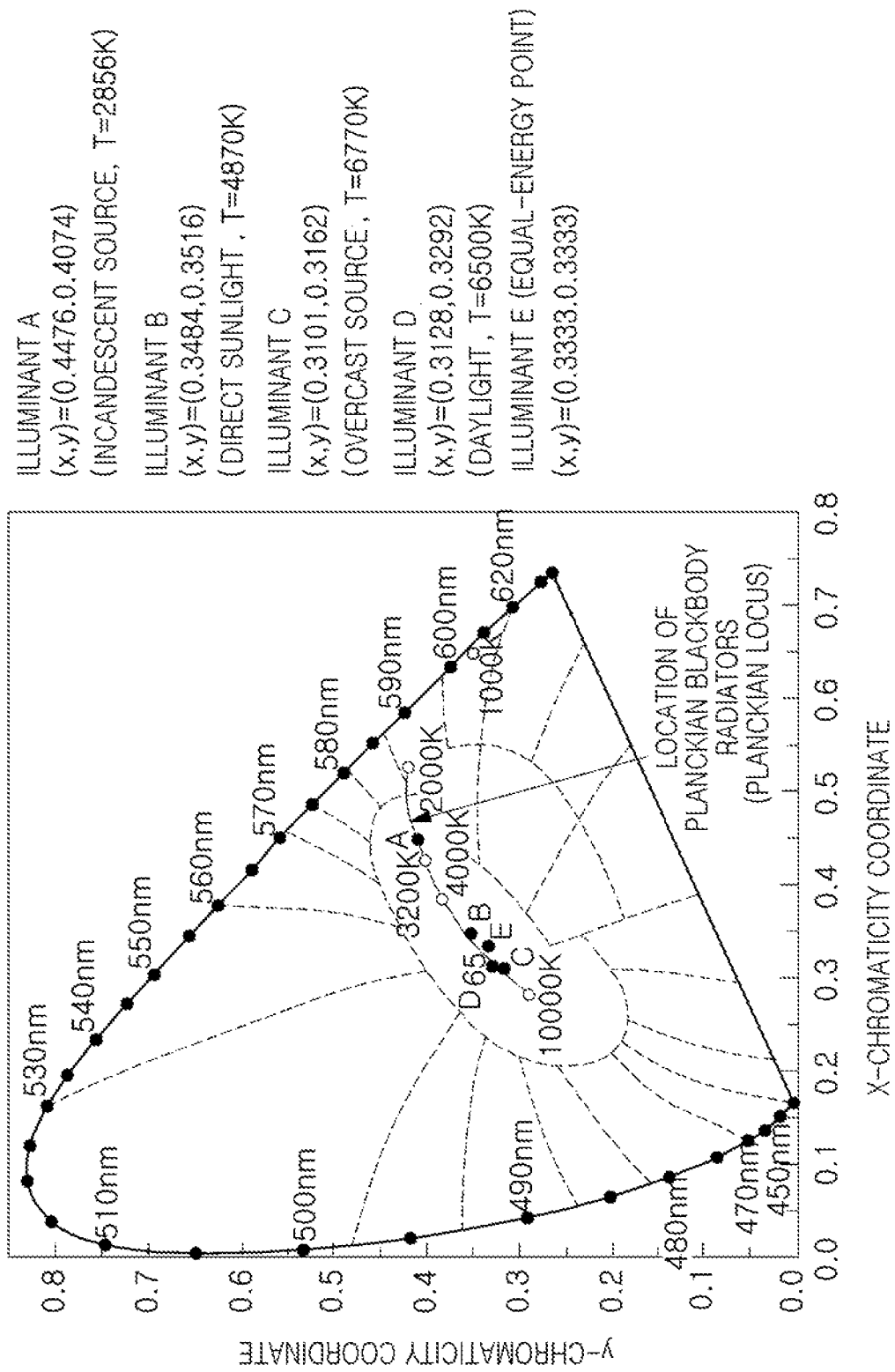
FIG. 8 is a CIE 1931 color space diagram illustrating a wavelength conversion material.

White light obtained by combining yellow, green, and red phosphors with a blue LED chip and/or combining with a green LED chip and a red LED chip with a blue LED chip, may have two or more peak wavelengths, and coordinates (x, y) of a CIE 1931 chromaticity coordinate system illustrated in FIG. 8 may be located on a line segment connecting (0.4476, 0.4074), (0.3484, 0.3516), (0.3101, 0.3162), (0.3128, 0.3292), and (0.3333, 0.3333). Alternatively, the coordinates (x, y) may be located in an area surrounded by the line segment and a blackbody radiation spectrum. A color temperature of the white light may range from about 2,000K to about 20,000K.

In FIG. 8, white light near a point E (0.3333, 0.3333) below the blackbody radiation spectrum may be used as a light source for lighting to create clearer viewing conditions for the naked eye in a state in which light having a yellow-based component is relatively reduced. Thus, a lighting product using white light in the vicinity of the point E (0.3333, 0.3333) below the blackbody radiation spectrum may be useful as lighting for a shopping arcade which sells groceries, clothing, and the like.

Phosphors may have the following formulae and colors:

Oxide-based Phosphors: yellow and green $Y_3Al_5O_{12}$:Ce, $Tb_3Al_5O_{12}$:Ce, and $Lu_3Al_5O_{12}$:Ce Silicate-based Phosphors: yellow and green $(Ba,Sr)_2SiO_4$:Eu, yellow and orange $(Ba,Sr)_3SiO_5$:Ce Nitride-based Phosphors: green $\beta$-SiAlON:Eu, yellow $La_3Si_6N_{11}$:Ce, orange $\alpha$-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$) (where, Ln may be at least one kind of element selected from the group consisting of group IIIA elements and rare earth elements, and M may be at least one kind of element selected from the group consisting of Ca, Ba, Sr and Mg)

Fluoride-based Phosphors: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$, $K_3SiF_7$:$Mn^{4+}$ A phosphor composition may need to fundamentally meet stoichiometry, and respective elements thereof may be replaced by other elements in respective groups on the periodic table. For example, Sr may be substituted with Ba, Ca, Mg, and the like of an alkaline earth group II, and Y may be replaced by Tb, Lu, Sc, Gd, and the like of lanthanide. Eu or the like, an activator, may be substituted with Ce, Tb, Pr, Er, Yb and the like according to required energy levels. The activator may only be applied, or an additional sub activator or the like may be applied to modify characteristics of the phosphor.

In particular, the fluoride-based red phosphors may be coated with a fluoride not containing Mn, respectively, or may further include an organic coating on a surface coated with a fluoride not containing Mn, in order to improve reliability at high temperatures and high humidity. In the case of the fluoride-based red phosphors described above, because a narrow full width at half maximum (FWHM) less than or equal to 40 nm may be implemented therewith, unlike other phosphors, the fluoride-based red phosphors may be used for a high-resolution television, such as ultra-high-definition televisions (UHD TVs).

In the wavelength conversion material, a material such as a quantum dot (QDs) or the like, may be used to substitute phosphor. In addition, a mixture of a phosphor and a QD, or a QD alone may be used as the wavelength conversion material.

The QD may have a core-shell structure using a III-V or II-VI compound semiconductor. For example, the QD may have a core, such as CdSe, InP, and the like, and a shell, such as ZnS, ZnSe, and the like. The QD may include a ligand for stabilizing the core and the shell. For example, a diameter of the core may range from about 1 nm to about 30 nm, further from about 3 nm to about 10 nm. A thickness of the shell may range from about 0.1 nm to about 20 nm, further from about 0.5 nm to about 2 nm.

The QD may implement light of various colors according to sizes thereof, and in particular, when used as a phosphor alternative, the QD may be employed as a red or green phosphor. In the case of using the QD, a narrow FWHM (e.g., about 35 nm) may be implemented.

Figure 9A:
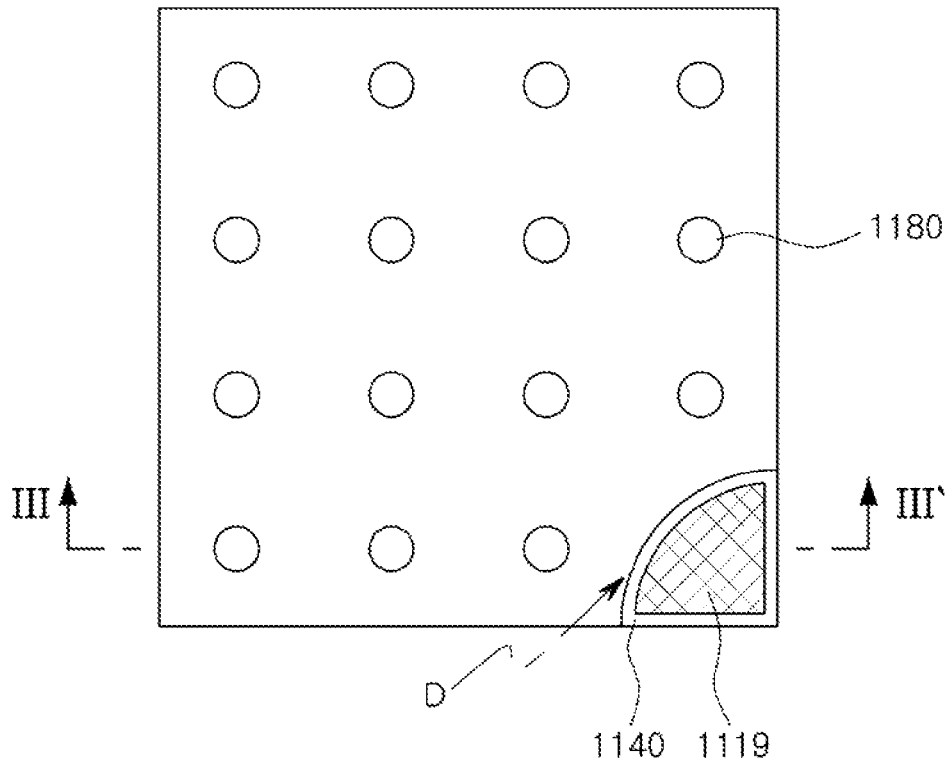
FIG. 9A, FIG. 9B, and FIG. 10 illustrate various examples of LED chips that may be used in a light emitting device according to one or more example embodiments.
Figure 9B:
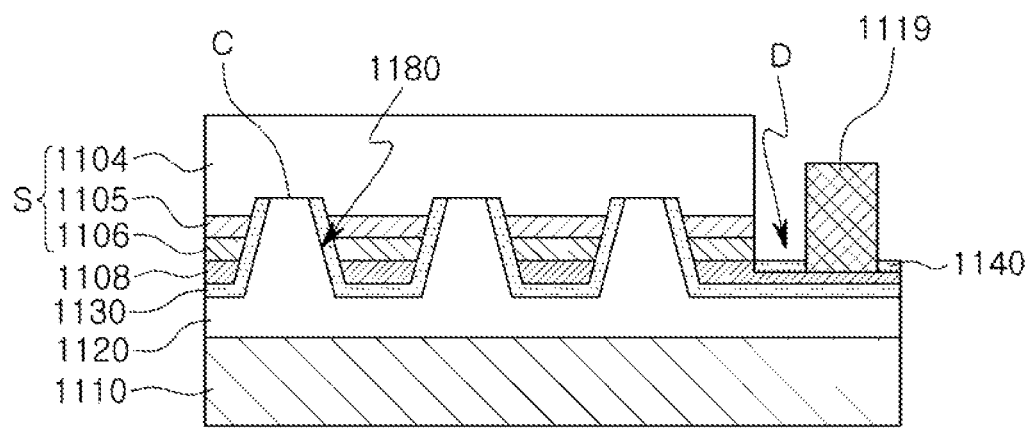
Figure 10:
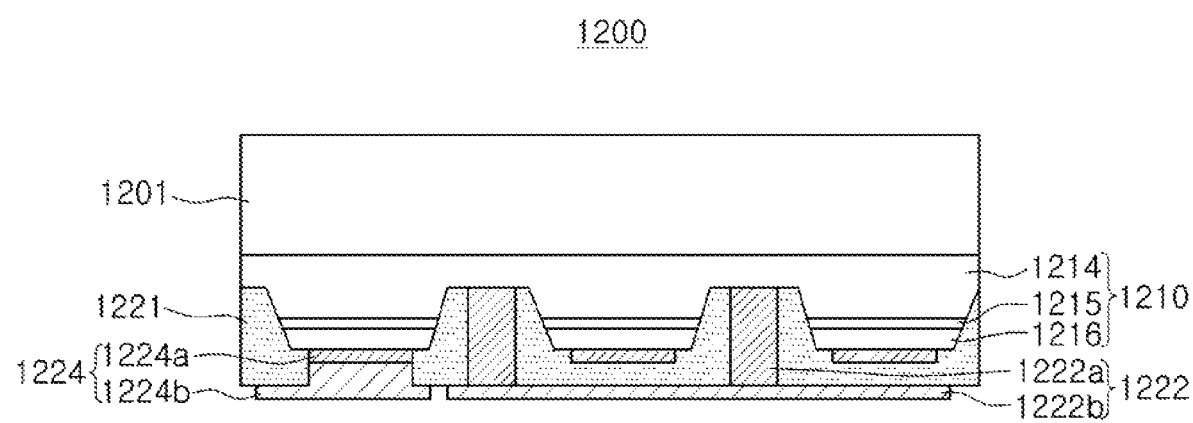

Hereinafter, LED chips according to various example embodiments will be described. FIG. 9A, FIG. 9B, and FIG. 10 illustrate various examples of LED chips that may be used for a light emitting device.

FIG. 9A is a plan view illustrating an example of an LED chip, and FIG. 9B is a side section view taken along line III-III' of the LED chip illustrated in FIG. 9A.

An LED chip 1100 illustrated in FIGS. 9A and 9B may have a large area structure for high output lighting. The LED chip 1100 may have a structure for increasing current dispersion efficiency and heat dissipation efficiency.

The LED chip 1100 may include a light emitting laminate S, a first electrode 1120, an insulating layer 1130, a second electrode 1108, and a conductive substrate 1110. The light emitting laminate S may include a first conductivity-type semiconductor layer 1104, an active layer 1105, and a second conductivity-type semiconductor layer 1106 stacked sequentially.

The first electrode 1120 may include one or more conductive vias 1180 electrically insulated from the second conductivity-type semiconductor layer 1106 and the active layer 1105 and extending to at least a portion of a region of the first conductivity-type semiconductor layer 1104 to be electrically connected to the first conductivity-type semiconductor layer 1104. The conductive vias 1180 may be extended from an interface of the first electrode 1120 to the inside of the first conductivity-type semiconductor layer 1104 while penetrating through the second electrode 1108, the second conductivity-type semiconductor layer 1106, and the active layer 1105. The conductive vias 1180 may be formed using an etching process, for example, inductively coupled plasma-reactive ion etching (ICP-RIE), or the like.

The first electrode 1120 may include the insulating layer 1130 provided thereon to electrically insulate the first electrode 1120 from other regions except the first conductivity-type semiconductor layer 1104. As illustrated in FIG. 9B, the insulating layer 1130 may be formed on a side surface of the conductive vias 1180 as well as in a space between the second electrode 1108 and the first electrode 1120. Thus, the second electrode 1108, the second conductivity-type semiconductor layer 1106 and the active layer 1105 exposed to the side surface of the conductive vias 1180 may be insulated from the first electrode 1120. The insulating layer 1130 may be formed by depositing an insulating material, such as $SiO_2$, $SiO_xN_y$, and $Si_xN_y$.

A contact area C of the first conductivity-type semiconductor layer 1104 may be exposed by the conductive vias 1180, and a portion of the first electrode 1120 may contact the contact area C through the conductive vias 1180. Thus, the first electrode 1120 may be connected to the first conductivity-type semiconductor layer 1104.

The conductive vias 1180 may be controlled in amount, shape, pitch, contact diameter with the first and second conductivity-type semiconductor layers 1104 and 1106, and the like, such that contact resistance may be reduced. The conductive vias 1180 may be arranged in various forms in rows and columns, and thus current flow may be improved. The amount and contact area of the conductive vias 1180 may be controlled such that the area of the contact area C may range from about 0.1% to about 20% of a plane area of the light emitting laminate S. For example, the area of the contact area C may range from 0.5% to 15%, further from 1% to 10%. When the area of the contact area C is less than 0.1%, light emitting characteristics may deteriorate due to non-uniform current dispersion, and when the area is increased greater than or equal to 20%, light emitting characteristics and brightness may be reduced due to a decrease in a light emitting area.

A radius of an area of the conductive vias 1180 contacting the first conductivity-type semiconductor layer 1104 may, for example, range from 1 μm to 50 μm, and the amount of the conductive vias 1180 may range from 1 to 48,000 per a light emitting laminate S area depending on the extent of the light emitting laminate S area. Although being different depending on the extent of the light emitting laminate S area, the amount of the conductive vias 1180 may range, for example, from 2 to 45,000, further from 5 to 40,000, and further from 10 to 35,000. The respective conductive vias 1180 may form a matrix structure having rows and columns, in which a distance between the respective conductive vias 1180 may range from 10 μm to 1,000 μm. For example, the distance may range from 50 μm to 700 μm, further from 100 μm to 500 μm, and further from 150 μm to 400 μm.

When the distance between the respective conductive vias 1180 is less than 10 μm, the number of the conductive vias 1180 may be increased and the light emitting area may be relatively reduced, and thus light emitting efficiency may deteriorate. When the distance is greater than 1,000 μm, current may not be evenly diffused, and thus light emitting efficiency may be decreased. A depth of the conductive vias 1180 may vary depending on thicknesses of the second conductivity-type semiconductor layer 1106 and the active layer 1105, and may range, for example, from 0.1 μm to 5.0 μm.

The second electrode 1108 may extend outside of the light emitting laminate S as illustrated in FIG. 9B to provide an exposed electrode formation region D. The electrode formation region D may include an electrode pad portion 1119 for connecting an external power source to the second electrode 1108. The electrode formation region D may be exemplified as being singular, but may be provided in plural if necessary. The electrode formation region D may be formed in a corner of the LED chip 1100 to maximize the light emitting area as illustrated in FIG. 9A.

As in the illustrated example embodiment, an insulating layer 1140 for etching stop may be disposed around the electrode pad portion 1119. The insulating layer 1140 formed as an etch stop layer may be formed in the electrode formation region D after the formation of the light emitting laminate S and before the formation of the second electrode 1108, and may function as an etch stop layer in an etching process for the electrode formation region D.

The second electrode 1108 may be formed using a material having high reflectivity to make an ohmic contact with the second conductivity-type semiconductor layer 1106. The reflective electrode material previously discussed may be used as a material for the second electrode 1108.

FIG. 10 is a side section view illustrating an example of an LED chip that may be employed according to an example embodiment.

Referring to FIG. 10, an LED chip 1200 may include a semiconductor laminate 1210 formed on a substrate 1201. The semiconductor laminate 1210 may include a first conductivity-type semiconductor layer 1214, an active layer 1215, and a second conductivity-type semiconductor layer 1216.

The LED chip 1200 may include a first electrode 1222 and a second electrode 1224 respectively connected to the first conductivity-type semiconductor layer 1214 and the second conductivity-type semiconductor layer 1216. The first electrode 1222 may include a connecting electrode portion 1222a, such as a conductive via, passing through the second conductivity-type semiconductor layer 1216 and the active layer 1215 to be connected to the first conductivity-type semiconductor layer 1214, and a first electrode pad 1222b connected to the connecting electrode portion 1222a. The connecting electrode portion 1222a may be surrounded by insulating portions 1221 to be electrically separated from the active layer 1215 and the second conductivity-type semiconductor layer 1216. The connecting electrode portion 1222a may be disposed in an area in which the semiconductor laminate 1210 is etched. The connecting electrode portion 1222a may be properly designed in number, shape, pitch or contact area with the first conductivity-type semiconductor layer 1214 such that contact resistance may be reduced. The connecting electrode portions 1222a may also be arranged to form rows and columns on the semiconductor laminate 1210 to improve current flow. The second electrode 1224 may include an ohmic contact layer 1224a on the second conductivity-type semiconductor layer 1216 and a second electrode pad 1224b.

The connecting electrode portion 1222a and the ohmic contact layer 1224a may have a structure in which a conductive material having an ohmic characteristic with the first and second conductivity-type semiconductor layers 1214 and 1216 is formed in a single or a multilayer structure. For example, the connecting electrode portion 1222a and the ohmic contact layer 1224a may be formed using a process of depositing or sputtering one or more materials, such as Ag, Al, Ni, Cr, a transparent conductive oxide (TCO), and the like.

The first and second electrode pads 1222b and 1224b may be connected to the connecting electrode portion 1222a and the ohmic contact layer 1224a, respectively, to function as an external terminal of the LED chip 1200. For example, the first and second electrode pads 1222b and 1224b may be formed using Au, Ag, Al, Ti, W, Cu, Sn, Ni, Pt, Cr, NiSn, TiW, AuSn or a eutectic metal thereof.

The first and second electrodes 1222 and 1224 may be disposed in an identical direction, and may be mounted on a lead frame or the like, in the form of a so-called flip chip.

In addition, the two electrodes 1222 and 1224 may be electrically separated from each other by the insulating portions 1221. The insulating portion 1221 may be formed using any material having electrically insulating characteristics, any object having electrically insulating characteristics, but a material having low light absorption characteristics. For example, a silicon oxide and a silicon nitride, such as $SiO_2$, $SiO_xN_y$, $Si_xN_y$, and the like may be used. If necessary, a light-reflective structure may be formed by dispersing a light-reflective filler in a light transmitting material. On the other hand, the insulating portions 1221 may have a multilayer reflective structure in which a plurality of insulating films having different refractive indices are alternately stacked. For example, such a multilayer reflective structure may be implemented by a distributed Bragg reflector (DBR) in which a first insulating film having a first refractive index and a second insulating film having a second refractive index are alternately stacked.

In the multilayer reflective structure, the plurality of insulating films having the different refractive indices may be repeatedly stacked from 2 to 100 times. For example, the plurality of insulating films may be repeatedly stacked from 3 to 70 times, further from 4 to 50 times. The plurality of insulating films having the multilayer reflective structure may be an oxide, such as $SiO_2$, $TiO_2$, $Al_2O_3$, or $ZrO_2$, a nitride, such as SiN, $Si_3N_4$, TiN, AlN, or TiAlN, and a combination thereof, such as $SiO_xN_y$. For example, when the wavelength of light generated by the active layer 1215 is indicated as λ, and n indicates a refractive index of a corresponding layer, the first and second insulating films may have a thickness of λ/4n, a thickness of about 300 Å to about 900 Å. At this time, the multilayer reflective structure may be designed by selecting refractive indices and thicknesses of the first and second insulating films, respectively, so as to have high reflectivity (95% or more) for the wavelength of light generated by the active layer 1215.

The refractive indices of the first and second insulating films may respectively be determined in a range of about 1.4 to about 2.5, and may be lower than a refractive index of the first conductive semiconductor layer 1214 and a refractive index of the substrate 1201, but may be greater than the refractive index of the substrate 1201 while being lower than the refractive index of the first conductive semiconductor layer 1214.

Figure 11:
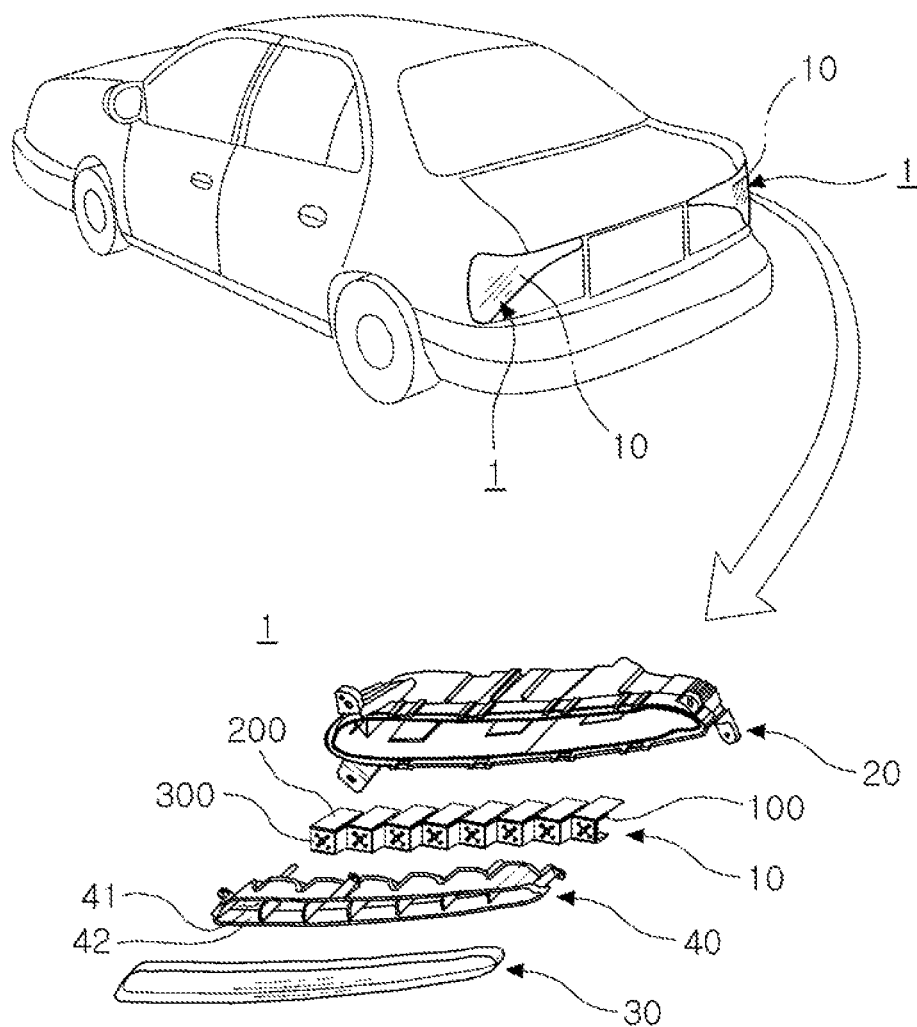
FIG. 11 is a perspective view schematically illustrating a lighting device according to an example embodiment.

FIG. 11 schematically illustrates a lighting device in which a light source module according to various example embodiments is employed. The lighting device according to the example embodiment may include, for example, rear lamps of a vehicle.

As illustrated in FIG. 11, a lighting device 1 may include a housing 20 supporting a light source module 10, and a cover 30 covering the housing 20 to protect the light source module 10, and a reflector 40 may be disposed on the light source module 10. The reflector 40 may include a plurality of reflective surfaces 41, and a plurality of through holes 42 provided in a bottom surface of each of the plurality of reflective surfaces 41. Light source units 300 of the light source module 10 may include light emitting devices 320 exposed to the plurality of reflective surfaces 41 through the plurality of through holes 42.

The lighting device 1 may have an overall gentle curved structure to correspond to a shape of a corner portion of a vehicle. Thus, a frame unit 100, and a plurality of heat dissipation units 200 and the light source units 300 attached to the frame unit 100 may form the light source module 10 having a step structure corresponding to the curved structure of the lighting device 1. Such a structure of the light source module 10 may be variously modified to correspond to designs of the lighting device 1, for example, the rear lamps.

Figure 12:
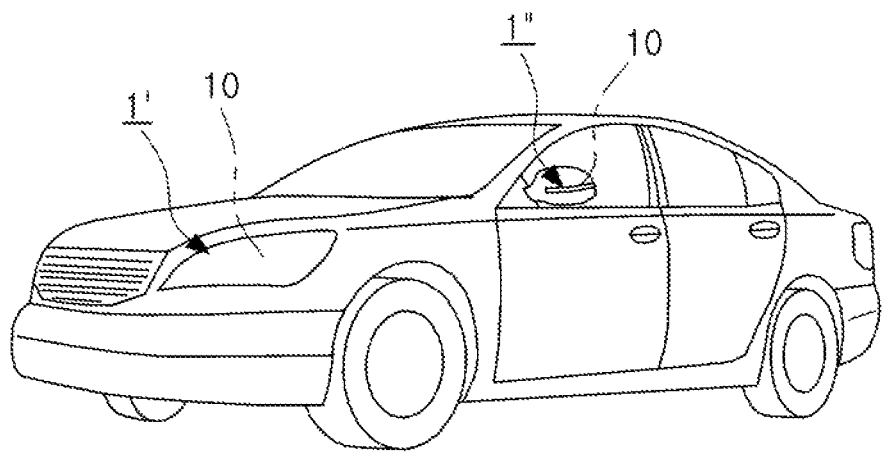
FIG. 12 is a perspective view schematically illustrating another example embodiment of the lighting device of FIG. 11.

The illustrated example embodiment relates to the case that the lighting device 1 is the rear lamps of the vehicle, but is not limited thereto. For example, as illustrated in FIG. 12, a lighting device 1' may include headlamps of a vehicle, and the light source module 10 may have a multi-step structure corresponding to a curved surface of each of the headlamps.

A lighting device 1" may also include an indicator light mounted in a door mirror of the vehicle. The light source module 10 may be easily attached to have a shape corresponding to a curved surface of the indicator light.

As set forth above, according to example embodiments, a light source module and a lighting device having the same may be provided to standardize a structure supporting light emitting devices to replace only a light emitting unit in which a defect occurs in a portion of light emitting devices among a plurality of light emitting units, thereby facilitating maintenance.

While example embodiments have been shown and described above, it will be apparent to those skilled in the art that modifications and variations could be made without departing from the scope of the present disclosure as defined by the appended claims.

What is claimed is:

1. A light source module comprising:
a frame comprising a plurality of mounting surfaces arranged at different levels and side surfaces respectively connected to each of the plurality of mounting surfaces;
a plurality of heat dissipaters each comprising a base portion disposed on each of the plurality of mounting surfaces, and an extension portion bent at an edge of the corresponding base portion and extending along at least one of the side surfaces of the frame and having an identical L-shape; and
a light source comprising a plurality of light emitting devices respectively disposed on each of the plurality of heat dissipaters and respectively positioned above each of the plurality of mounting surfaces,
wherein the at least one of the side surfaces of the frame is covered by the plurality of heat dissipaters.

2. The light source module of claim 1, wherein the frame comprises at least one protrusion disposed on each of the plurality of mounting surfaces, and the base portion comprises at least one connecting hole into which the at least one protrusion is inserted.

3. The light source module of claim 1, wherein the extension portion is substantially perpendicular to the base portion, and extends downward past the at least one of the side surfaces of the frame.

4. The light source module of claim 1, wherein each of the plurality of mounting surfaces of the frame has a corresponding heat dissipater of the plurality of heat dissipaters disposed thereon.

5. The light source module of claim 1, wherein each of the plurality of mounting surfaces of the frame has a corresponding pair of heat dissipaters among the plurality of heat dissipaters overlappingly disposed thereon.

6. The light source module of claim 5, wherein each of the corresponding pair of heat dissipaters extends along opposing side surfaces connected to each of the plurality of mounting surfaces.

7. The light source module of claim 1, wherein the frame comprises a stepped structure defining the different levels of the plurality of mounting surfaces rise in an arrangement direction.

8. The light source module of claim 7, wherein the frame further comprises a plurality of connecting surfaces vertically connecting the plurality of mounting surfaces to each other.

9. The light source module of claim 1, wherein the light source further comprises a substrate disposed between the plurality of heat dissipaters and the plurality of light emitting devices, the substrate having the plurality of light emitting devices mounted thereon.

10. The light source module of claim 9, wherein the substrate integrally connects the plurality of heat dissipaters.

11. The light source module of claim 9, wherein the substrate has a stepped structure corresponding to the plurality of mounting surfaces.

12. The light source module of claim 1, wherein the plurality of heat dissipaters continuously cover the at least one of the side surfaces of the frame.

13. A lighting device for a vehicle comprising:
a light source module;
a housing supporting the light source module; and
a cover fastened to the housing to cover the light source module,
wherein the light source module comprises:
a frame having a plurality of mounting surfaces arranged at different levels and side surfaces respectively connected to the plurality of mounting surfaces;
a plurality of heat dissipaters each comprising a base portion disposed on each of the plurality of mounting surfaces, and an extension portion bent at an edge of the corresponding base portion and extending along at least one of the side surfaces of the frame and having an identical L-shape; and
a plurality of light emitting devices respectively disposed on the plurality of heat dissipaters and respectively positioned above the plurality of mounting surfaces,
wherein the at least one of the side surfaces of the frame is covered by the plurality of heat dissipaters.

14. The lighting device of claim 13, further comprising a reflector configured to reflect light of the light source module.

15. The lighting device of claim 14, wherein the reflector comprises a plurality of reflective surfaces and a plurality of through holes respectively formed on a bottom surface of each of the plurality of reflective surfaces, and the plurality of light emitting devices are respectively exposed to the plurality of reflective surfaces through the plurality of through holes.

16. A light emitting device comprising:
a stepped frame defining a plurality of mounting surfaces, a first side surface and a second side surface;
a first plurality of heat dissipaters, each of the first plurality of heat dissipaters comprising a first connecting portion respectively disposed on the plurality of mounting surfaces and a first extension portion bent at an edge of the corresponding first connecting portion and extending along the first side surface and having an identical L-shape; and a plurality of light sources respectively disposed on the first connecting portion of each of the first plurality of heat dissipaters, wherein the first side surface of the stepped frame is covered by the first plurality of heat dissipaters.

17. The light emitting device of claim 16, further comprising a second plurality of heat dissipaters, each of the second plurality of heat dissipaters comprising a second connecting portion respectively disposed on the plurality of first connecting portions and a second extension portion extending along the second side surface.

18. The light emitting device of claim 16, wherein the stepped frame further defines a plurality of protrusions, each of the plurality of protrusions respectively disposed on the plurality of mounting surfaces, and the first plurality of heat dissipaters comprises a plurality of through holes corresponding to the plurality of protrusions.

19. The light emitting device of claim 16, further comprising a wavelength converter comprising a phosphor, the wavelength converter located so light emitted from the plurality of light sources is incident on the phosphor.

20. The light emitting device of claim 16, wherein each of the plurality of light sources comprises a light emitting diode.

* * * * *